(12) United States Patent
Goudarzi et al.

(10) Patent No.: US 8,390,126 B2
(45) Date of Patent: Mar. 5, 2013

(54) METHOD AND ARRANGEMENT FOR REDUCED THERMAL STRESS BETWEEN SUBSTRATES

(75) Inventors: Vahid Goudarzi, Coral Springs, FL (US); Juli A. Abdala, SW Ranches, FL (US); Gulten Goudarzi, Coral Springs, FL (US)

(73) Assignee: Motorola Mobility LLC, Libertyville, IL (US)

( * ) Notice: Subject to any disclaimer, the term of this patent is extended or adjusted under 35 U.S.C. 154(b) by 1516 days.

(21) Appl. No.: 10/678,489

(22) Filed: Oct. 3, 2003

(65) Prior Publication Data

US 2005/0074955 A1   Apr. 7, 2005

(51) Int. Cl.
*H01L 23/48* (2006.01)
(52) U.S. Cl. ........... 257/772; 257/E21.508; 438/611
(58) Field of Classification Search .......... 438/611–614, 438/618–619, 760, 772; 257/737–738, E21.508, 257/E21.511
See application file for complete search history.

(56) References Cited

U.S. PATENT DOCUMENTS

| | | | | |
|---|---|---|---|---|
| 5,130,779 A | * | 7/1992 | Agarwala et al. | 257/772 |
| 5,346,118 A | * | 9/1994 | Degani et al. | 228/180.22 |
| 5,539,153 A | * | 7/1996 | Schwiebert et al. | 174/260 |
| 5,634,268 A | * | 6/1997 | Dalal et al. | 29/840 |
| 5,854,514 A | * | 12/1998 | Roldan et al. | 257/746 |
| 6,020,561 A | * | 2/2000 | Ishida et al. | 174/261 |
| 6,077,725 A | * | 6/2000 | Degani et al. | 438/108 |
| 6,150,717 A | * | 11/2000 | Wood et al. | 257/738 |
| 6,281,041 B1 | * | 8/2001 | Ho et al. | 438/106 |
| 6,507,113 B1 | | 1/2003 | Fillion et al. | |
| 6,583,517 B1 | | 6/2003 | Jimarez | |
| 6,608,389 B1 | | 8/2003 | Hashimoto | |
| 6,610,559 B2 | | 8/2003 | Wang et al. | |
| 6,644,536 B2 | * | 11/2003 | Ratificar et al. | 228/234.1 |
| 6,767,819 B2 | | 7/2004 | Lutz | |
| 6,784,086 B2 | | 8/2004 | Ray et al. | |
| 7,413,110 B2 | | 8/2008 | Goudarzi et al. | |
| 2002/0162880 A1 | | 11/2002 | Jackson et al. | |

OTHER PUBLICATIONS

Patent Cooperation Treaty, "PCT Search Report and Written Opinion of the International Searching Authority" for International Application No. PCT/US2006/04208 Aug. 17, 2006, 7 pages.

* cited by examiner

*Primary Examiner* — David Vu

(57) ABSTRACT

A module (20) can include a first substrate (12) comprised of a first material, at least a second substrate (22) comprised of at least a second material, selectively applied solder (14) of a first composition residing between the first substrate and at least the second substrate, and selectively applied solder (16) of at least a second composition residing between the first substrate and at least the second substrate. Preferably, no crack will exist in the module as a result of a reflow process of the solder due to the CTE mismatch between the first and second substrates. The different selectively applied solder compositions can have different melting points and can be solder balls, solder paste, solder preform or any other known form of solder.

14 Claims, 4 Drawing Sheets

- 42 — SELECTIVELY APPLY SOLDER OF A FIRST COMPOSITION BETWEEN A FIRST SUBSTRATE AND A SECOND SUBSTRATE, WHEREIN THE FIRST SUBSTRATE AND THE SECOND SUBSTRATE ARE COMPRISED OF DIFFERING MATERIALS
- 44 — PLACING HIGHER MELTING POINT SOLDER BUMPS OR PASTE ON PRINTED SOLDER PADS ON AT LEAST ONE AMONG THE FIRST SUBSTRATE AND AT LEAST THE SECOND SUBSTRATE
- 46 — SELECTIVELY APPLY SOLDER OF AT LEAST A SECOND COMPOSITION BETWEEN THE FIRST SUBSTRATE AND THE SECOND SUBSTRATE
- 48 — PLACING LOWER MELTING POINT SOLDER BUMPS OR PASTE ON PRINTED SOLDER PADS ON AT LEAST ONE AMONG THE FIRST SUBSTRATE AND AT LEAST THE SECOND SUBSTRATE
- 50 — SELECTIVELY APPLY SOLDER OF THE FIRST COMPOSITION TO A SUBSTANTIALLY CENTRALLY LOCATED AREA ON AT LEAST ONE AMONG THE FIRST SUBSTRATE AND THE SECOND SUBSTRATE AND SELECTIVELY APPLY SOLDER OF AT LEAST THE SECOND COMPOSITION TO A SUBSTANTIALLY PERIPHERALLY LOCATED AREA ABOUT THE CENTRALLY LOCATED AREA
- 52 — REFLOW THE SOLDER OF THE FIRST COMPOSITION AND THE SECOND COMPOSITION, WHEREIN A CRACK-FREE BOND FORMS BETWEEN THE FIRST AND SECOND SUBSTRATE

METHOD AND ARRANGEMENT FOR REDUCED THERMAL STRESS BETWEEN SUBSTRATES

CROSS-REFERENCE TO RELATED APPLICATIONS

Not applicable.

FIELD OF THE INVENTION

This invention relates in general to the application of solder between substrates, and more particularly to the use of multiple solder materials between different substrates.

BACKGROUND OF THE INVENTION

Soldered modules that include substrates of differing substrate materials are subject to thermal stress due to differing coefficients of thermal expansion (CTE) between the respective substrates. For example, due to CTE, cracks in the solder and possibly elsewhere (the substrates themselves) occur during the reflow process when attempting to solder a ceramic substrate to a printed circuit board (PCB) material such as FR4.

Differing CTEs among substrates is also commonly known as CTE mismatch. A typical PCB material can have a CTE of 15 PPM/Degree C. while a Ceramic substrate can have a CTE of 6 PPM/Degree C. Thus, cracks are initiated during the cooling process (of the reflow process) as the solder materials between the PCB and ceramic solidifies while the PCB and ceramic are not fully in a steady state. Note that Pb-free solder paste (95.5% Sn-3.8% Ag-0.7% Cu) solidifies at 217 degree C. while the PCB and the Ceramic are still contracting at different rates as the temperature is reduced. As a result, cracks form in the ceramic and possibly the solder as well.

SUMMARY OF THE INVENTION

Embodiments in accordance with the invention illustrate an arrangement and method of forming a module having at least two substrates of differing material that can remain substantially free from cracks during and after a reflow process.

In a first aspect of the present invention, a method of reducing stress between substrates of differing materials includes the steps of selectively applying solder of a first composition between a first substrate and a second substrate and selectively applying solder of at least a second composition between the first substrate and the second substrate. Then, the method can include the step of reflowing the solder of the first composition and the second composition. Ideally, the bond formed between the first and second substrates is crack-free. The crack-free bond should be understood to mean that the solder and the substrates will be substantially free from cracks. The solder of the first composition can be made of higher melting-point solder bumps or paste or preform on printed solder pads on at least one among the first substrate and at least the second substrate while the solder of the second composition can be lower melting-point solder bumps or paste or preform on printed solder pads on at least one among the first substrate and at least the second substrate. Of course, in the alternative, the first composition can be the lower melting point solder and the second composition can be the higher melting point solder. Optionally, the solder of the first composition can be substantially centrally located while the second composition can substantially or generally be located in a peripheral area about the centrally located solder. Of course, the solder of each composition can be selectively placed as desired to suitably minimize cracking or to meet other requirements that might be dictated by components populating the substrate or by the structure of the substrate themselves.

In a second aspect of the present invention, a module can include a first substrate comprised of a first material, at least a second substrate comprised of at least a second material, selectively applied solder of a first composition residing between the first substrate and at least the second substrate, and selectively applied solder of at least a second composition residing between the first substrate and at least the second substrate. Preferably, no crack will exist in the module as a result of a reflow process of the solder. The different selectively applied solder compositions can have different melting points and can be solder balls, solder paste, solder preform or any other known form of solder.

BRIEF DESCRIPTION OF THE DRAWINGS

FIG. 4 is a flow chart illustrating a method of reducing stress between substrates of differing materials in accordance with an embodiment of the present invention.

DETAILED DESCRIPTION OF THE DRAWINGS

Figure 1:
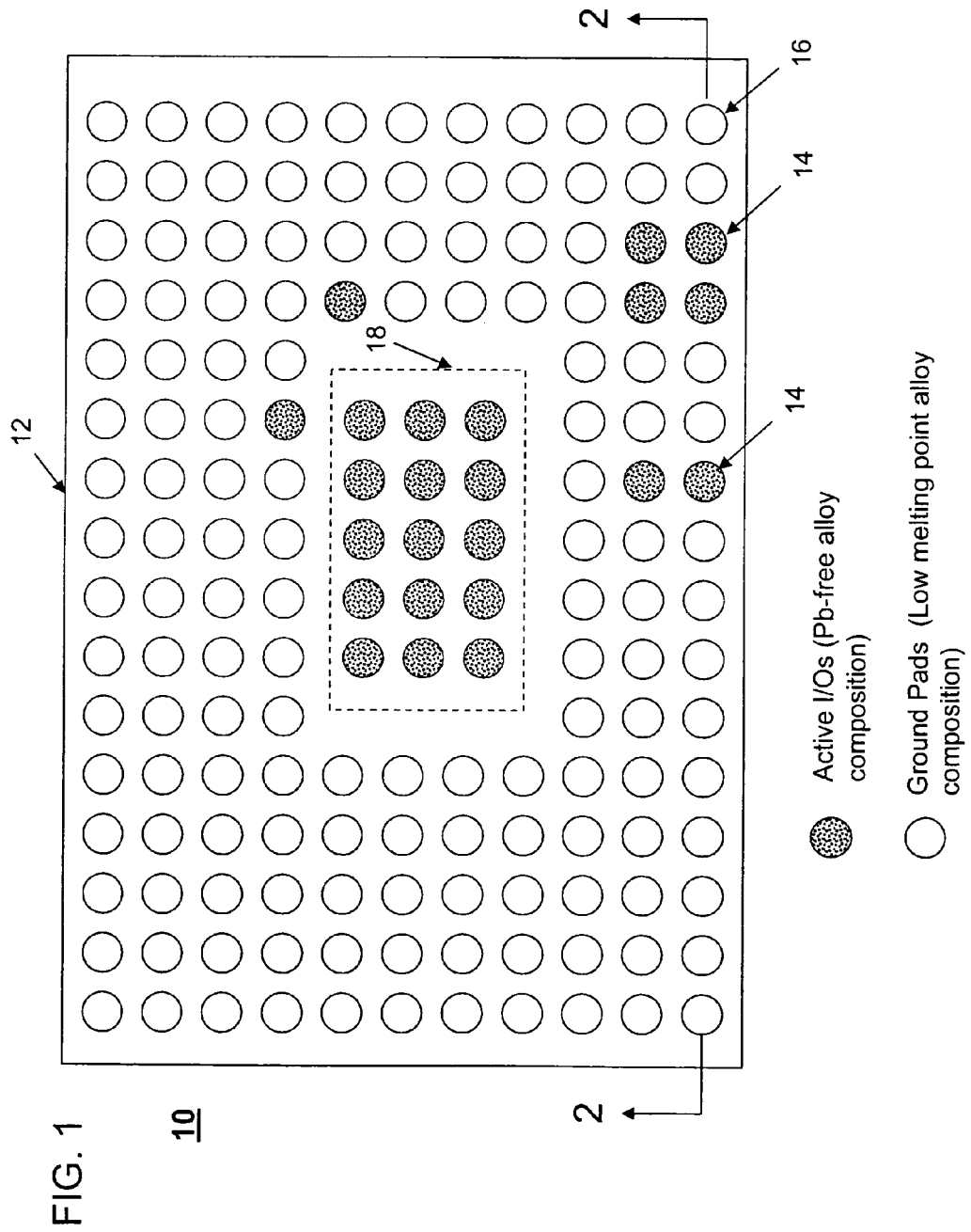
FIG. 1 illustrates a top view of a portion of a ball grid array module using different solder on different areas of a substrate in accordance with an embodiment of the present invention.

While the specification concludes with claims defining the features of the invention that are regarded as novel, it is believed that the invention will be better understood from a consideration of the following description in conjunction with the drawing figures, in which like reference numerals are carried forward.

Figure 2:
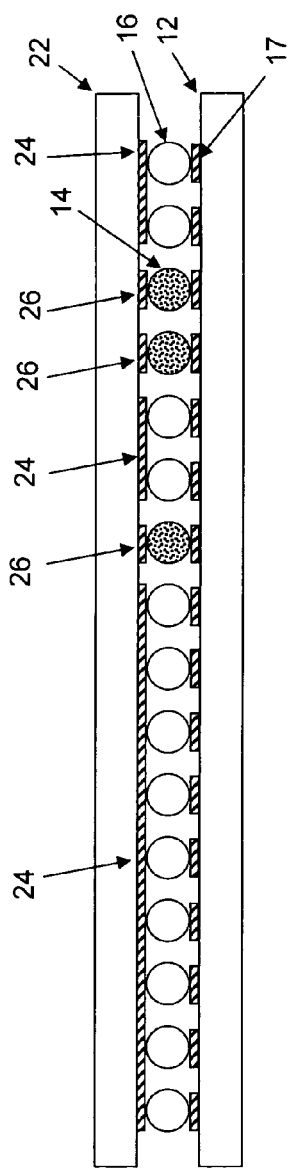
FIG. 2 shows a side cut view along line 2-2 of a module including the portion of the module of FIG. 1.

Referring to FIG. 1, a top view of a portion 10 of a ball grid (BGA) array module using different solder compositions on different areas of a substrate 12 is shown. The ball grid array module or package can use a two alloy composition system to minimize stress on the package, although any other suitable number of alloys is within contemplation of the present invention. The portion 10 can include selectively applied solder 14 of a first composition or material and can further include selectively applied solder 16 of a second composition or material. Although the solder discussed above can be of any form (such as preform or paste), FIGS. 1 and 2 illustrate the use of solder balls. The solder 14 of the first composition can be a higher melting point solder such as lead-free solder bumps, solder paste or solder preform having a composition of 95.5% Sn, 3.8% Ag, and 0.7% Cu. This particular composition solidifies at 217 degrees C. The solder of the second composition can be low melting point solder bumps having a composition of approximately 57% Bi, 42% Sn, 1% Ag which can solidify at 139 degrees C. If solder preform or paste is used, the low melting point solder can alternatively be composed of approximately 43% Sn, 43% Pb, 14% Bi which can solidify at 144 degrees C. Of course, these solder compositions are merely exemplary and should not be interpreted to limit the scope of the invention in any manner. As noted above, the different selectively applied solder compositions can also come in different forms such as solder balls, solder paste, solder preform or any other known form of solder Referring to FIG. 2, a side view of a module 20 is shown including the substrate 12 and solder 14 and 16. More particularly, the module 20 can include the substrate 12 (which can be a first substrate comprised of a first material such as FR4) and at least a second substrate 22 comprised of at least a second material such as ceramic. As shown, the selectively applied solder 14 and 16 can reside between the first substrate 12 and the second substrate 22. The solder 14 and 16 can reside between printed solder pads 17 on the first substrate 12 and solder pads 24 and 26.

Figure 5:
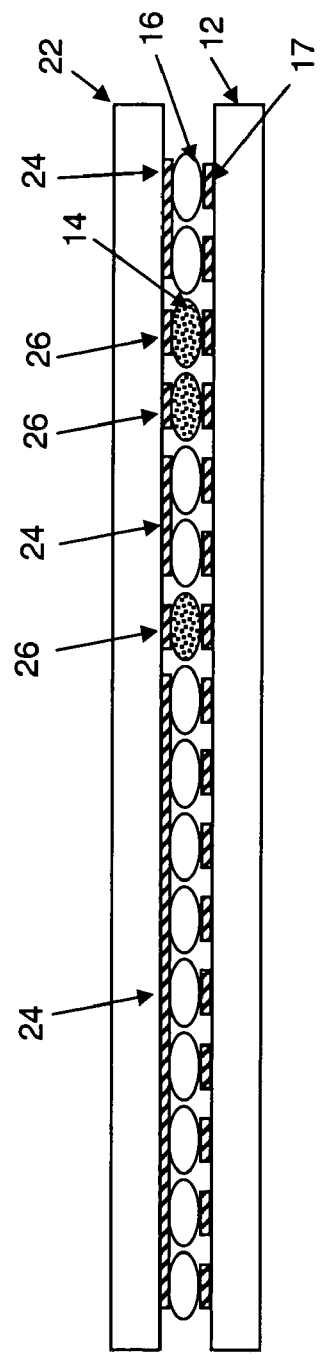
FIG. 5 illustrates an example of a reflowed module.

In the example shown in FIGS. 1 and 2, thermal stress on the module 20 is minimized by applying the higher melting point solder (14) at the center area 18 of the substrate 12 or the module 20 which can include active input/output connections or pads (I/Os) through solder pads 26 of substrate 22 while lower melting point solder (16) is applied on the perimeter area of the substrate 12 or the module 20 which can include a ground plane through solder pads 24 of substrate 22. In this instance, solder connections through I/Os would require a higher reliability than connections through the ground plane. Also note that these substrates will tend to expand and contract at a higher rate at the periphery of the substrates rather that at their center areas. Thus, two different solder compositions are placed strategically on the substrates so that areas that would traditionally experience maximum stress during reflow, no longer are subject to such stress. In this manner, cracks in the solder and the substrates (particularly a ceramic substrate) due to the reflow process will be reduced or completely eliminated. By reducing the solidus temperature of the solder from 217 degrees C. to 144 degrees C. or 139 degrees C., the stress on the substrates starts at a much lower temperature (144 or 139 degrees C.) as the substrates contract during the reflow process. As a result, the stress on the ceramic or other components in the module is significantly reduced. Once, the module 20 is reflowed, a BGA package is formed. An example of a reflowed module 50 is shown in FIG. 5. As can be seen, after reflow, the higher melting point solder 14 and the lower melting point solder 16 are vertically separated and are both in a collapsed state.

Additionally, the use of lead-free bumps on the I/O can minimize air void formations and increases the process window. Furthermore, the low melting point bumps can be used on any part of the module where the CTE mismatch between the ceramic and PCB is maximized due to the PCB inner structure or due to component requirements.

Figure 3:
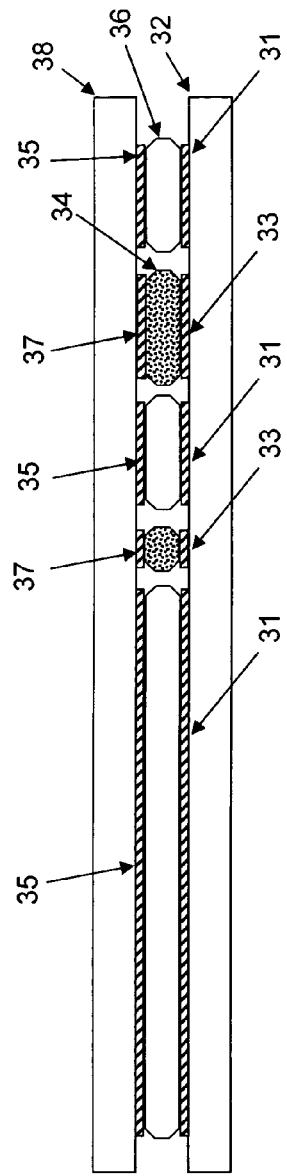
FIG. 3 illustrates a side cut view of another module that uses solder paste or preforms in accordance with an embodiment of the present invention.

Referring to FIG. 3, a module 30 similarly structured to the module 20 is shown. In this instance solder paste or solder preforms are used as opposed to solder balls. More particularly, the module 30 can include the substrate 32 (which can be a first substrate comprised of a first material such as FR4) and at least a second substrate 38 comprised of at least a second material such as ceramic. As shown, the selectively applied solder 34 and 36 can reside between the first substrate 32 and the second substrate 38. The solder 34 and 36 can reside between printed solder pads 31,33 on the first substrate 32 and solder pads 35,37 on the second substrate. Solder pads 33 and 37 can provide the I/O connection while solder pads 31 and 35 can provide a connection to a ground plane.

Referring to FIG. 4, a flow chart illustrating a method 40 of reducing stress between substrates of differing materials is shown. The method 40 can include the step 42 of selectively applying solder of a first composition between a first substrate and a second substrate and the step 46 of selectively applying solder of at least a second composition between the first substrate and the second substrate. Then, the method can include the step 52 of reflowing the solder of the first composition and the second composition (see FIG. 5 for an example of a reflowed module). Optionally, the step of applying the solder of the first composition can include applying higher melting point solder bumps or paste or preform on printed solder pads on at least one among the first substrate and at least the second substrate at step 44 while the step of applying the solder of the second composition can include applying lower melting point solder bumps or paste or preform on printed solder pads on at least one among the first substrate and at least the second substrate at step 48. Of course, in the alternative, the first composition can be the lower melting point solder and the second composition can be the higher melting point solder. Optionally, at step 50, the solder of the first composition can be placed in a substantially central location while the second composition can generally be placed in a peripheral area about the central location. Of course, the solder of each composition can be selectively placed as desired to suitably minimize cracking or to meet other requirements that might be dictated by components populating the substrate or by the structure of the substrate themselves.

Thus, the embodiments in accordance with the invention solves among other problems, the problem of CTM mismatch when using different substrates in modules. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

Additionally, the description above is intended by way of example only and is not intended to limit the present invention in any way, except as set forth in the following claims.

What is claimed is:

1. A module, comprising:
a first substrate comprised of a first material;
at least a second substrate comprised of at least a second material;
solder of a first composition residing between the first substrate and at least the second substrate on at least a first area; and
solder of at least a second composition residing between the first substrate and at least the second substrate on at least a separate area from the first area such that the solder of the first composition and the solder of the second composition are vertically separated;
wherein both the solder of the first composition and the solder of the second composition are in a collapsed state.

2. The module of claim 1, wherein the first substrate has a first coefficient of thermal expansion and the second composition has a second coefficient of thermal expansion.

3. The module of claim 1, wherein the first substrate is comprised of a printed circuit board material having a coefficient of thermal expansion and the second substrate is a ceramic material having a different coefficient of thermal expansion.

4. The module of claim 1, wherein the solder of the first composition has a higher melting point solder than the solder of the second composition.

5. The module of claim 4, wherein the higher melting point solder is comprised of approximately 95.5% Sn, 3.8% Ag and 0.7% Cu.

6. The module of claim 4, wherein the solder of the first composition is on input/output solder pads.

7. The module of claim 4, wherein the solder of the second composition is comprised of approximately 57% Bi, 42% Sn, and 1% Ag.

8. The module of claim 4, wherein the solder of at least the second composition is on ground pads.

9. The module of claim 1 wherein the module is a ball grid array package.

10. The module of claim 1, wherein the solder of the first composition and the solder of at least the second composition are comprised of solder balls.

11. The module of claim 10, wherein the solder of the first composition is in a substantially centrally located area on at least one among the first substrate and the second substrate and the solder of at least the second composition is in a substantially peripherally located area about the centrally located area, wherein the solder of the first composition has a higher melting point than the solder of the second composition.

12. The module of claim 1, wherein the solder of the first composition and the solder of at least the second composition are comprised of solder paste.

13. The module of claim 1, wherein the solder of the first composition is in a substantially centrally located area on at least one among the first substrate and the second substrate and the solder of at least the second composition is in a substantially peripherally located area about the centrally located area, wherein the solder of the first composition has a higher melting point than the solder of the second composition.

14. The module of claim 1, wherein at least one among the first substrate and the second substrate further comprises a plurality of solder pads and the solder of the first composition is on a different set of solder pads among the plurality of solder pads than the solder of the second composition.

\* \* \* \* \*